(12) United States Patent
Latypov et al.

(10) Patent No.: US 7,768,653 B2
(45) Date of Patent: *Aug. 3, 2010

(54) METHOD AND SYSTEM FOR WAVEFRONT MEASUREMENTS OF AN OPTICAL SYSTEM

(75) Inventors: Azat Latypov, Danbury, CT (US); Sherman K. Poultney, Wilton, CT (US); Yuli Vladimirsky, Weston, CT (US)

(73) Assignee: ASML Hodling N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/178,524

(22) Filed: Jul. 23, 2008

(65) Prior Publication Data
US 2009/0021748 A1    Jan. 22, 2009

Related U.S. Application Data

(63) Continuation of application No. 10/848,179, filed on May 19, 2004, now Pat. No. 7,408,651.

(51) Int. Cl.
*G01B 9/02* (2006.01)
(52) U.S. Cl. ..................................... 356/515
(58) Field of Classification Search .............. 356/515, 356/521
See application file for complete search history.

(56) References Cited

U.S. PATENT DOCUMENTS

| 4,413,909 A | 11/1983 | Pohle |
| 4,953,981 A | 9/1990 | Hales |
| 5,042,950 A | 8/1991 | Salmon, Jr. |
| 5,062,705 A | 11/1991 | Sato et al. |
| 5,168,128 A | 12/1992 | Thomsen |
| 5,229,872 A | 7/1993 | Mumola |
| 5,296,891 A | 3/1994 | Vogt et al. |
| 5,333,050 A | 7/1994 | Nose et al. |

(Continued)

FOREIGN PATENT DOCUMENTS

DE    103 17 278 A1    11/2003

(Continued)

OTHER PUBLICATIONS

First Non-Final Rejection mailed May 10, 2006 for U.S. Appl. No. 10/848,179, filed May 19, 2004, 12 pgs.

(Continued)

*Primary Examiner*—Samuel A Turner
(74) *Attorney, Agent, or Firm*—Sterne, Kessler, Goldstein & Fox, P.L.L.C.

(57) ABSTRACT

A wavefront measurement system includes a source of electromagnetic radiation. An illumination system delivers the electromagnetic radiation to an object plane. A source of a diffraction pattern is in the object plane. A projection optical system projects the diffraction pattern onto an image plane, which includes a mechanism (e.g., a shearing grating) to introduce the lateral shear. A detector is located optically conjugate with the pupil of the projection optical system, and receives an instant fringe pattern, resulting from the interference between sheared wavefronts, from the image plane. The diffraction pattern is dynamically scanned across a pupil of the projection optical system, and the resulting time-integrated interferogram obtained from the detector is used to measure the wavefront aberration across the entire pupil.

20 Claims, 9 Drawing Sheets

U.S. PATENT DOCUMENTS

| | | | |
|---|---|---|---|
| 5,424,552 A | 6/1995 | Tsuji et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,615,029 A | 3/1997 | Moddel et al. | |
| 5,677,703 A | 10/1997 | Bhuva et al. | |
| 5,715,039 A | 2/1998 | Fukuda et al. | |
| 5,777,789 A | 7/1998 | Chiu et al. | |
| 5,808,797 A | 9/1998 | Bloom et al. | |
| 5,982,553 A | 11/1999 | Bloom et al. | |
| 6,057,913 A | 5/2000 | Brown et al. | |
| 6,118,535 A | 9/2000 | Goldberg et al. | |
| 6,133,986 A | 10/2000 | Johnson | |
| 6,177,980 B1 | 1/2001 | Johnson | |
| 6,262,845 B1 | 7/2001 | Sweatt | |
| 6,266,147 B1 | 7/2001 | Naulleau | |
| 6,360,012 B1 | 3/2002 | Kreuzer | |
| 6,373,553 B1 | 4/2002 | Singh | |
| 6,498,685 B1 | 12/2002 | Johnson | |
| 6,573,997 B1 | 6/2003 | Goldberg et al. | |
| 6,650,399 B2 | 11/2003 | Baselmans et al. | |
| 6,674,519 B2 | 1/2004 | Mui | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,816,247 B1 | 11/2004 | Heppner et al. | |
| 6,847,461 B1 | 1/2005 | Latypov et al. | |
| 6,867,846 B2 | 3/2005 | Poultney | |
| 6,965,436 B2 | 11/2005 | Latypov et al. | |
| 7,002,747 B2* | 2/2006 | Augustyn et al. | 359/572 |
| 7,019,824 B2 | 3/2006 | Wegmann et al. | |
| 7,158,237 B2 | 1/2007 | Schriever et al. | |
| 2001/0028462 A1 | 10/2001 | Ichihara et al. | |
| 2002/0001088 A1 | 1/2002 | Wegmann et al. | |
| 2002/0122162 A1 | 9/2002 | Nakauchi et al. | |
| 2002/0145717 A1* | 10/2002 | Baselmans et al. | 355/55 |
| 2003/0071204 A1 | 4/2003 | Sandstrom et al. | |
| 2003/0137655 A1 | 7/2003 | Wegmann | |
| 2004/0041104 A1 | 3/2004 | Liebregts et al. | |
| 2004/0130561 A1 | 7/2004 | Jain | |
| 2004/0169866 A1 | 9/2004 | Poultney | |
| 2004/0174539 A1 | 9/2004 | Tyczka et al. | |
| 2005/0007572 A1 | 1/2005 | George et al. | |
| 2005/0134824 A1 | 6/2005 | Poultney et al. | |
| 2005/0225859 A1 | 10/2005 | Latypov et al. | |
| 2005/0259269 A1 | 11/2005 | Latypov et al. | |
| 2006/0001890 A1 | 1/2006 | Poultney | |
| 2007/0046912 A1 | 3/2007 | Schriever et al. | |
| 2008/0309898 A1 | 12/2008 | Baselmans | |
| 2008/0309899 A1 | 12/2008 | Baselmans et al. | |

FOREIGN PATENT DOCUMENTS

| | | |
|---|---|---|
| JP | 10-170399 A | 6/1998 |
| JP | 11-304653 A | 11/1999 |
| JP | 2002-367900 A | 12/2002 |
| JP | 2003-524175 A | 8/2003 |
| JP | 2003-309066 A | 10/2003 |
| WO | WO 98/33096 A1 | 7/1998 |
| WO | WO 98/38597 A2 | 9/1998 |
| WO | WO 98/38597 A3 | 9/1998 |
| WO | WO 01/63233 A2 | 8/2001 |
| WO | WO 03/076891 A2 | 9/2003 |

OTHER PUBLICATIONS

Second Non-Final Rejection mailed Jan. 4, 2007 for U.S. Appl. No. 10/848,179, filed May 19, 2004, 24 pgs.

First Final Rejection mailed May 11, 2007 for U.S. Appl. No. 10/848,179, filed May 19, 2004, 5 pgs.

Third Non-Final Rejection mailed Sep. 24, 2007 for U.S. Appl. No. 10/848,179, filed May 19, 2004, 16 pgs.

Notice of Allowance mailed Mar. 27, 2008 for U.S. Appl. No. 10/848,179, filed May 19, 2004, 7 pgs.

Second Notice of Allowance mailed Sep. 4, 2008 for U.S. Appl. No. 10/848,179, filed May 19, 2004, 6 pgs.

Third Notice of Allowance mailed Feb. 25, 2009 for U.S. Appl. No. 10/848,179, filed May 19, 2004, 11 pgs.

Durr, P. et al., "Characterization of Spatial Light Modulators for Micro Lithography," *Proceedings of SPIE*, vol. 4985, pp. 266-276 (2003).

Durr, P. et al., "Test system for micro mirror arrays," *Proceedings of SPIE*, vol. 4178, pp. 358-364 (2000).

Lakner, H. et al., "Design and Fabrication of Micromirror Arrays for UV-Lithography," *Proceedings of SPIE*, vol. 4561, pp. 255-264 (2001).

Sandstrom, T. et al., "Pattern Generation with SLM Imaging," *Proceedings of SPIE*, vol. 4562, pp. 38-44 (2002).

Sandstrom, T. and Eriksson, N., "Resolution extensions in the Sigma 7000 imaging pattern generator," Micronic Laser Systems AB, Strategic Development, Molndalsvagen 91, SE-435 54 GOTEBORG; Sweden, 11 pages.

Search Report for Singapore Patent Application No. 200503134-9 dated Sep. 24, 2007, 7 pages.

English Abstract for Japanese Publication No. JP2003-524175T published Aug. 12, 2003, 1 pg.

Office Action and Translation of Office Action for Japanese Patent Application No. 2005-147251 mailed May 16, 2008, 7 pgs.

English Abstract for JP 2002-367900 A published Dec. 20, 2002, 1 pg.

Braat et al., "Improved Ronchi Test with Extended Source," J. Opt. Soc. Am. A, vol. 16, No. 1, pp. 131-140 (Jan. 1999).

Naulleau et al., "Static Microfield Printing at the Advanced Light Source with the ETS Set-2 Optic," Proc. SPIE 4688-05, pp. 64-71 (2002).

Monteverde, Robert, "Spatial Light Modulators Illuminate a Wide Variety of Application Spaces," Laser Focus World, Jan. 2004.

Chinese Office Action for Application No. 200510072774.6 mailed Sep. 10, 2008, 9 pgs.

Search Report from European Patent Application No. 05010342.3, dated Jun. 19, 2008, 3 pages.

Rejection for Japanese Patent Application No. 2005-147251 mailed Oct. 9, 2008, 4 pgs.

Examination for European Application No. 05 010 342.3 mailed Oct. 30, 2008, 5 pgs.

\* cited by examiner

METHOD AND SYSTEM FOR WAVEFRONT MEASUREMENTS OF AN OPTICAL SYSTEM

CROSS REFERENCE TO RELATED APPLICATIONS

This application is a continuation of U.S. patent application Ser. No. 10/848,179, filed on May 19, 2004, which is issuing as U.S. Pat. No. 7,408,651, that will issue on 2008 Aug. 5, titled "Method and System for Wavefront Measurements of an Optical System", which is incorporated herein by reference in its entirety.

BACKGROUND OF THE INVENTION

1. Field of the Invention

The present invention is generally related to photolithography systems, and more particularly, to measuring wavefront parameters in a photolithographic system.

2. Related Art

Lithography is a process used to create features on the surface of substrates. Such substrates can include those used in the manufacture of flat panel displays, circuit boards, various integrated circuits, and the like. A frequently used substrate for such applications is a semiconductor wafer. One skilled in the relevant art would recognize that the description herein would also apply to other types of substrates.

During lithography, a wafer, which is disposed on a wafer stage (WS), is exposed to an image projected onto the surface of the wafer by an exposure system located within a lithography system. The exposure system includes a reticle (also called a mask) for projecting the image onto the wafer.

The reticle is usually mounted on a reticle stage (RS) and generally located between the wafer and a light source. In photolithography, the reticle is used as a photo mask for printing a circuit on the wafer, for example. Lithography light shines through the mask and then through a series of optical lenses that shrink the image. This small image is then projected onto the wafer. The process is similar to how a camera bends light to form an image on film. The light plays an integral role in the lithographic process. For example, in the manufacture of microprocessors (also known as computer chips), the key to creating more powerful microprocessors is the size of the light's wavelength. The shorter the wavelength, the more transistors can be formed on the wafer. A wafer with many transistors results in a more powerful, faster microprocessor.

As chip manufacturers have been able to use shorter wavelengths of light, they have encountered a problem of the shorter wavelength light becoming absorbed by the glass lenses that are intended to focus the light. Due to the absorption of the shorter wavelength light, the light fails to reach the silicon wafer. As a result, no circuit pattern is created on the silicon wafer. In an attempt to overcome this problem, chip manufacturers developed a lithography process known as Extreme Ultraviolet Lithography (EUVL). In this process, a glass lens can be replaced by a mirror.

The problem of measuring the undesirable perturbations of the wavefront (often referred to as wavefront aberrations) is a persistent one for the lithographic applications. These wavefront aberrations result from various physical causes, such as changes in refractive or reflective properties of the optical elements (lenses or mirrors) occurring as a result of mechanical displacements or deformations, or changes in the optical properties of the optical elements caused by heating, or light-induced compaction. In particular, it is desirable to be able to measure wavefront quality in the photolithographic tool during wafer production and exposure, rather than having to take the tool offline in order to do so, which increases cost of ownership, reduces through-put or introduces some other type of inefficiency.

SUMMARY OF THE INVENTION

The present invention is directed to a scanning interferometer with dynamic pupil fill that substantially obviates one or more of the problems and disadvantages of the related art.

An embodiment of the present invention includes a wavefront measurement system including a source of electromagnetic radiation. An illumination system delivers the electromagnetic radiation to an object plane. An object generates a diffraction pattern and is located in the object plane. A projection optical system projects an image of the object onto an image plane. A detector receives a fringe pattern from the image plane. The diffraction pattern is scanned across a pupil of the projection optical system.

Another embodiment of the present invention includes a wavefront measurement system with an illumination system that delivers electromagnetic radiation at an object plane. A source of a beam of the electromagnetic radiation is in the object plane. A projection optical system focuses the beam onto an image plane. A detector receives a fringe pattern of the beam from the image plane. The beam is scanned across a pupil of the projection optical system.

Another embodiment of the present invention includes a method of measuring a wavefront of an optical system including generating electromagnetic radiation at a source; delivering the electromagnetic radiation at an object plane of the optical system; generating a diffraction pattern at the object plane; scanning the diffraction pattern across a pupil of the optical system; receiving an image of the source while scanning the diffraction pattern; and determining wavefront parameters from the image.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to illustrate exemplary embodiments of the invention and are incorporated in and constitute a part of this specification, illustrate embodiments of the invention and together with the description serve to explain the principles of the invention. In the drawings.

DETAILED DESCRIPTION OF EMBODIMENTS OF THE INVENTION

Reference will now be made in detail to the embodiments of the present invention, examples of which are illustrated in the accompanying drawings.

It is convenient to characterize field-dependent aberrations of a projections optics (PO) by an aberration of a wavefront of a spherical wave emitted from a corresponding field point in the object plane. Various interferometry techniques can be used to measure aberration of this spherical wave. Shearing interferometry based on an extended incoherent source in the object plane superimposed with an object-plane grating matching the shearing grating is described in J. Braat and A. J. E. M. Janssen, *Improved Ronchi test with Extended Source*, J. Opt. Soc. Am. A, Vol. 16, No. 1, pp. 131-140, January 1999, incorporated by reference herein. Also, the paper by Naulleau et al., *Static Microfield Printing at the ALS with the ETS-2 Set Optic*, Proc. SPIE 4688, 64-71 (2002) (http://goldberg.l-bl.gov/papers/Naulleau_SPIE_4688 (2002).pdf), incorporated by reference herein describes the dynamic pupil fill illumination system for EUV implemented in order to control partial coherence during printing at a synchrotron light source where illumination is coherent.

Figure 1:
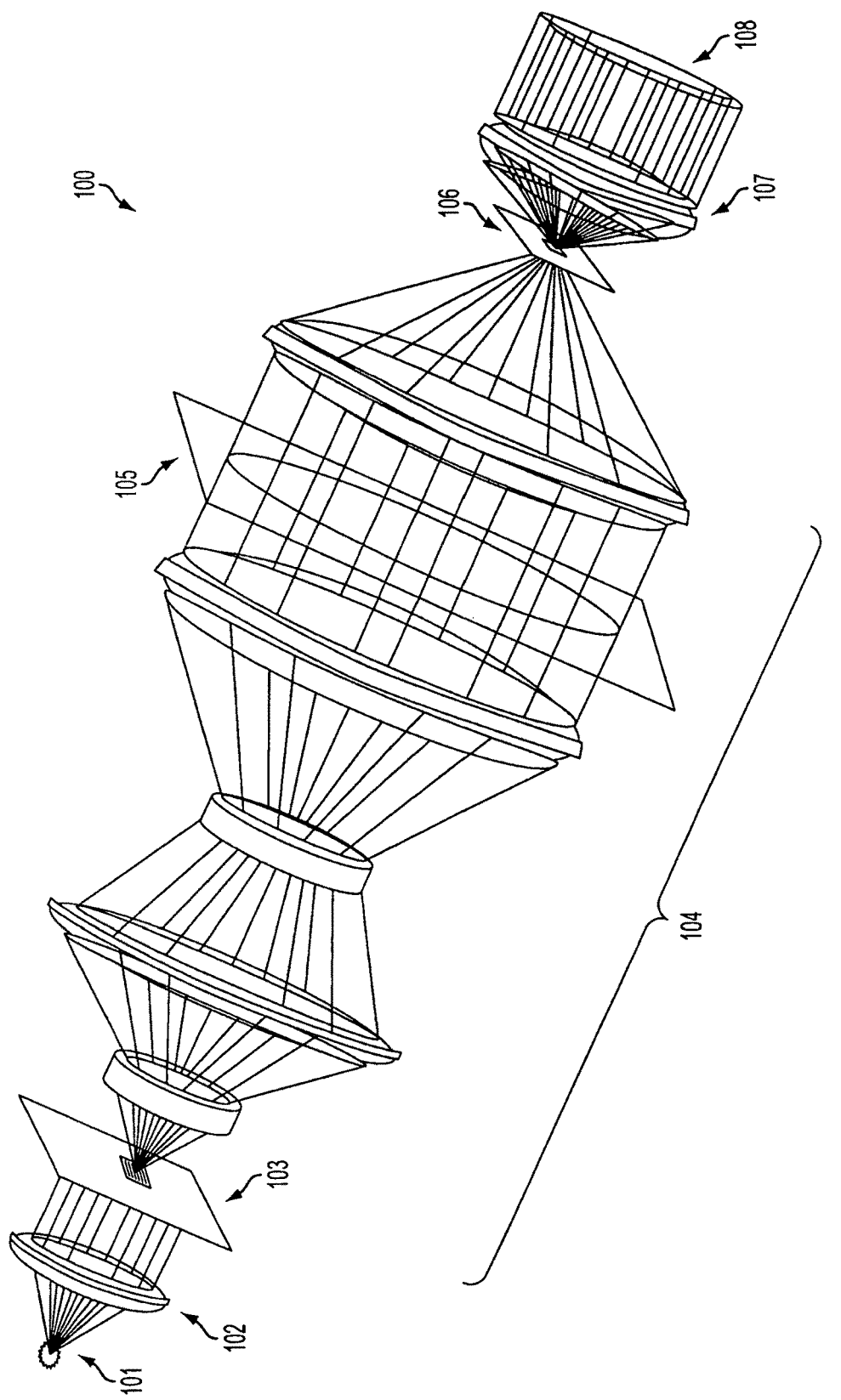
FIG. 1 shows a portion of an exemplary photolithographic system of the present invention.

FIG. 1 illustrates a photolithographic system 100 according to the present invention. The system 100 includes an illumination source 105, a condenser lens 102, an extended object 103 (located in the object plane), projection optics 104 with a pupil 105, an image plane shearing grating 106, a detector lens 107 and a CCD detector 108, arranged as shown in the figure. These elements will be discussed further below.

The grating 106 includes both transmissive and opaque regions. The opaque regions can be formed of materials that absorb the radiation (for example, for 13.5 nm exposure wavelength in the case of EUV lithography, or optical radiation in the case of lithographic systems using longer wavelengths), such as nickel, chromium or other metals.

It will also be appreciated that although the present invention is applicable to lithographic systems that use refractive optical elements (such as the projection optics 104, and the imaging optics), the invention is also applicable to systems using other wavelengths, with appropriate transmissive/refractive components used in place of reflective ones, as needed.

The grating 106 also can include reflective (or opaque) regions. These reflective regions can be formed of materials that absorb the radiation (for example, for 13.5 nm EUV exposure wavelength), such as nickel, chromium or other metals.

The pitch of the grating 106 is chosen to provide an appropriate shear ratio, where the CCD detector 108 is in the fringe plane (i.e., below the focal, or image, plane of the system), and "sees" a pattern of fringes (an interferogram) or a number of overlapping circles, as will be discussed further below. The shear ratio is a measure of the overlap of two circles, where a shear ratio of zero represents perfect overlap. Note also that it is desirable for the CCD detector 108 to "see" only the zeroth order and the + and $-1^{st}$ order diffraction images, and to eliminate the + and $-2^{nd}$ order diffraction images. Furthermore, the extended object 103 is constructed to aid in eliminating unwanted orders. It is important, however, that whichever pattern of transmission and reflection areas is used, that it be a regular pattern.

The pitch of the source module grating 203 is also preferably chosen to match the pitch of the shearing grating so as to redistribute the light in the pupil to those locations that will mutually overlap as a result of shearing.

Figure 2:
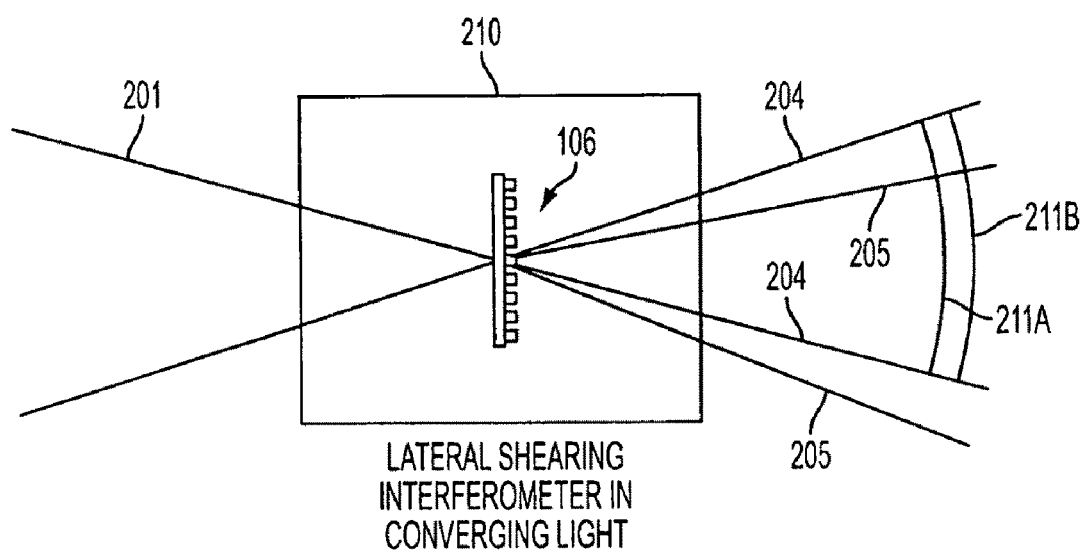
FIGS. 2 and 3 illustrate the use of an interferometer to produce shear wavefronts.
Figure 3:
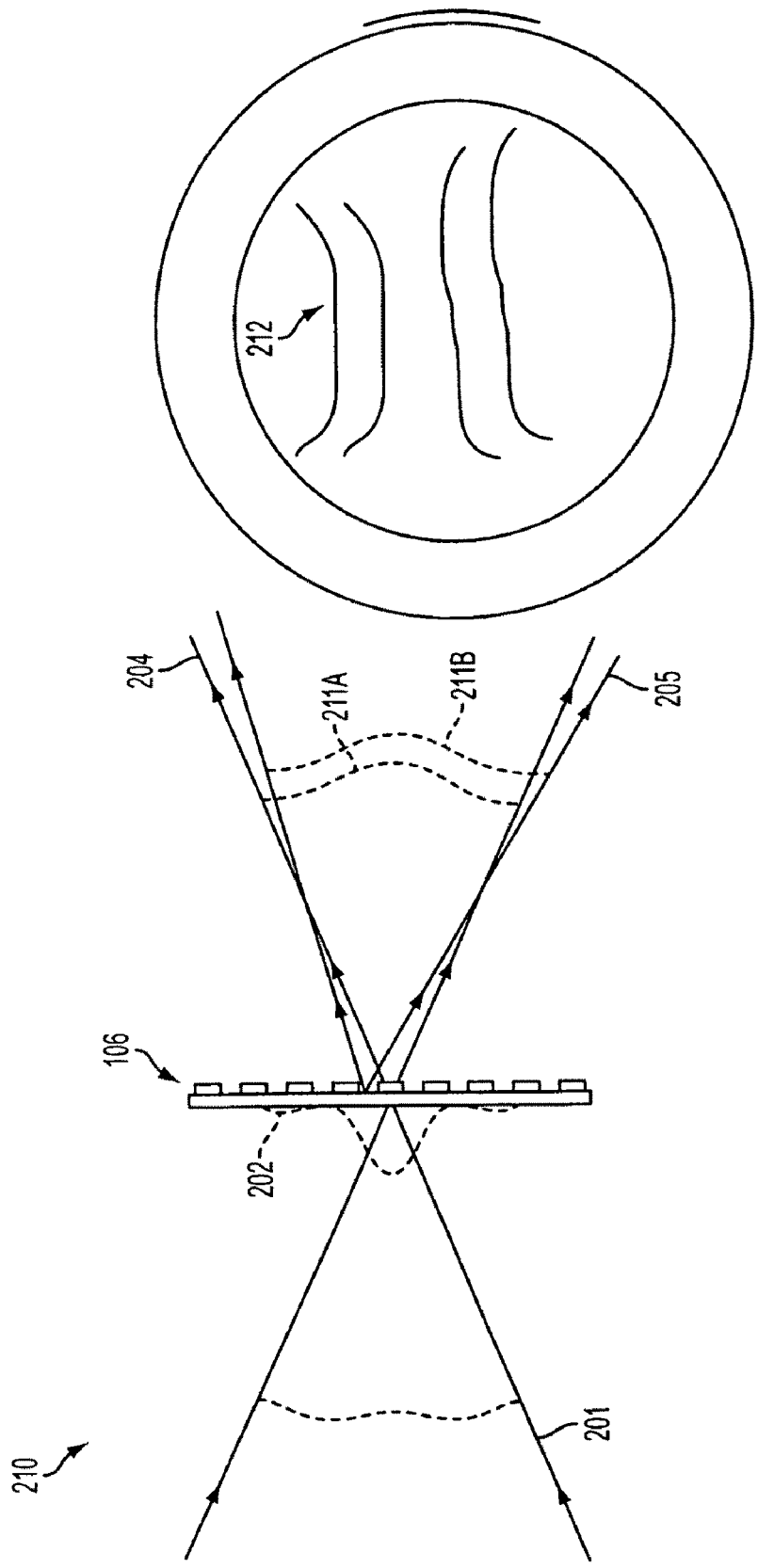

FIGS. 2 and 3 illustrate reference wavefronts and shear in a lateral shearing interferometer 210. The lateral shearing interferometer 210 interferes a wavefront with itself, or, phrased another way, it interferes a shifted copy of the wavefront with itself. As shown in FIGS. 2 and 3, the grating 106, positioned in the image plane, acts as a shearing interferometer, and generates a transmitted waves 204 with a wavefront 211A, and a diffracted reference wave 205 with a wavefront 211B. Thus, the lateral shearing interferometer 210 creates one or more apparent sources, whose wavefronts 211A, 211B interfere to produce fringes 212.

Figure 4:
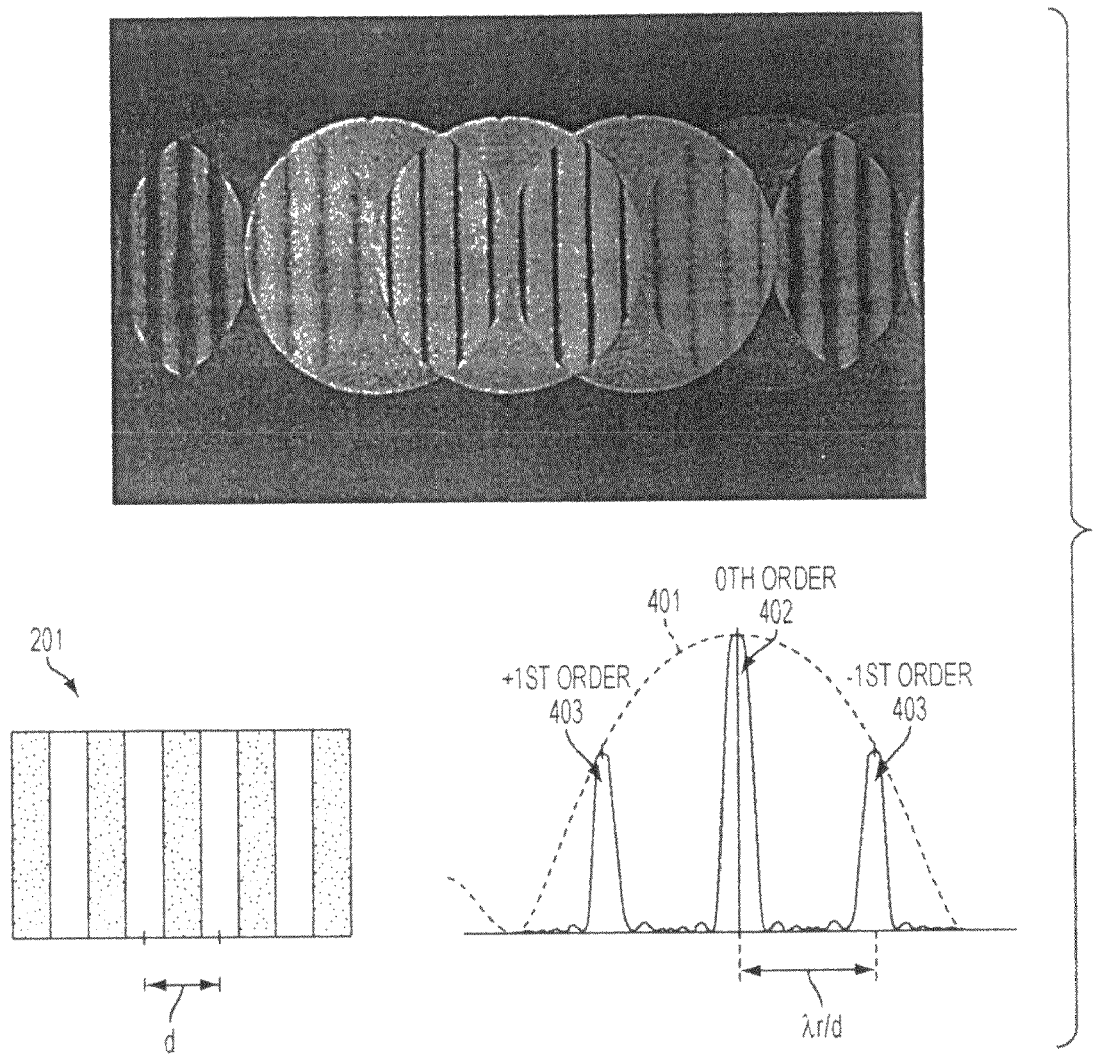
FIG. 4 illustrates an example of interference fringes as they appear at the focal plane with the use of the present invention.

FIG. 4 illustrates the wavefront fringes (212A, 212B in FIG. 2) as seen by the CCD detector 108. As shown in FIG. 4, in the upper right-hand photograph, sheared fringes for a single object space slit are shown, where the slit is positioned in front of an incoherent, diffuse source that fills the maximum numerical aperture and smoothes any wavefront inhomogeneities. The bottom right-hand figure shows a fringe visibility function 401, with zeroth order pattern 502 and first order diffraction patterns 403. The 50% duty cycle on the grating 106 makes all even orders of the diffraction pattern invisible. At the bottom left of FIG. 4, the image space sharing grating 106 is shown, with a shear ratio of 0.5.

In practice, a source point (101) is replaced by the "extended object 103" to increase the optical throughput. The minimal dimensions of the extended object 103 are dictated by the available illumination power and the sensitivity of the detector device used to measure the interferograms. Depending on the object-side numerical aperture (NA) of the projection optics 104 and the optical throughput requirements, it is often the case that the angular width of the diffraction pattern from the extended object 103 is small compared to the object-side NA of the PO 104. In that case, most of the light from this object ends up concentrated within a small area of the PO 104 pupil 105. Even for the highest pupil fills of the projection optics 104, the pupil 105 is still not completely filled, as is preferred for a complete aberration measurement. In this situation, the wavefront measurement methods will have very little sensitivity to the PO 104 aberrations occurring outside a relatively small illuminated area of the pupil 105. It is therefore preferred to fill the pupil 105 of the PO 104 more or less uniformly.

Thus, the problem of measuring wavefront aberrations has to balance two competing interests: filling the entire pupil 105 (but at the cost of very low intensity), or having sufficient intensity, but only on a small portion of the pupil 105.

The following methods can be used to ensure the desired pupil fill in shearing interferometry:

(1) introducing a transmissive pattern inside the extended object 103 that matches the shearing grating (e.g., a Ronchi grating) and providing a fully incoherent illumination of the extended object 103 [see Baselmans, supra]; and (2) placing an extended incoherent source into an object plane (by using a critical illumination or a diffuser in the object plane) and superimposing it with a Ronchi grating that matches the shearing grating [see Bratt et al., supra].

These methods have several problems:

(1) speckle disturbance of the measured interferograms occurs due to the remaining coherence of the effective source (this applies to methods 1 and 2) or due to a finite size of the object plane diffuser elements (this applies to method 2). The speckle disturbance adds high-frequency intensity fluctuations to the measured interferograms, resulting in wavefront measurement errors;

(2) the need to switch to a special illumination mode (this applies to methods 1 and 2) during the measurement complicates the wavefront measurement process; and (3) a significant portion of light is diffracted from the extended object 103 away from the pupil 105 and does not participate in a formation of the sheared interferogram.

The present invention thus applies to the situation when the size of the extended object 103 needed to ensure the required optical throughput is such that the characteristic width of the diffraction pattern is much less than the object side NA of the PO 104, i.e., $\lambda$/extended object size<<NA object.

The pupil fill by the extended object 103 can be achieved dynamically. During the measurement of the interferogram, the extended object 103 can be dynamically modified, so that the diffraction pattern from this object scans across the whole entrance pupil 105. The CCD detector 108 that measures the sheared interferogram integrates (or sums) the momentary interferograms occurring in the process of measurement.

The dynamic modification of an extended object 103 can be performed by using a reflective element, such as a tilting mirror, or by using a refractive object with varying slope and/or other characteristics (e.g., a parabolic or spherical lens) moved against an aperture.

The reflected and transmissive extended objects described above use dynamic phase variation of light induced by linearly varying complex reflectivity/transmittance within or across the extended object 103. However, arbitrary (non-linear) phase variation effect can be also used to fill the pupil 105 dynamically. Many physical arrangements well known to those skilled in the art are possible for realizing such arbitrary non-linear phase variations. For instance, they can be achieved by using an extended movable object with its structure changing within or across it, and/or dynamically deformed, and/or otherwise dynamically modified (e.g., using spatial light modulators). Other possible realizations of dynamically introduced phase variation can include a diffusor pattern formed on a transmissive or reflective flexible substrate that can be physically deformed, including plastics, piezoelectric materials, and stress-birefringent materials whose stresses are induced by actuators, etc.

Unless very small shears are utilized, in either of the above methods, the extended object 103 must have a transmittance pattern (an object plane Ronchi grating matching the shearing grating) superimposed on it to provide additional redistribution of light in the pupil 105, as described in Bratt et al. and Baselmans, cited above.

The dynamic modification is performed so that the transmittance function within the extended object has a time-dependent linear variation of the phase that ensures that the diffraction pattern from the extended object is shifted within the pupil 105, dynamically sweeping the pupil 105 during the act of measurement.

The measurement of the interferogram is performed by the CCD detector 108 that records energy distribution across the CCD detector 108 plane. The CCD detector 108 is capable of integrating the time-varying intensity at every point in the detector 108 plane to collect a sufficient number of photons during the act of measurement. The CCD arrays used in present-day wavefront sensors (like the CCD detector 108) satisfy this requirement.

As noted above, the dynamic modification of the extended object 103 can be achieved by any number of mechanisms. For instance, a reflective extended object 103 may be used. Examples of such reflective objects include:

(1) A tilting flat mirror can be used in a combination with an aperture, or having only a small flat portion of a large tilting object to be reflective. A relatively large tilting mirror is easier to control (e.g., to tilt and rotate) compared to a micro-mirror. The extended object 103 in this case coincides with the tilting flat mirror, as shown in FIG. 9.

Figure 9:
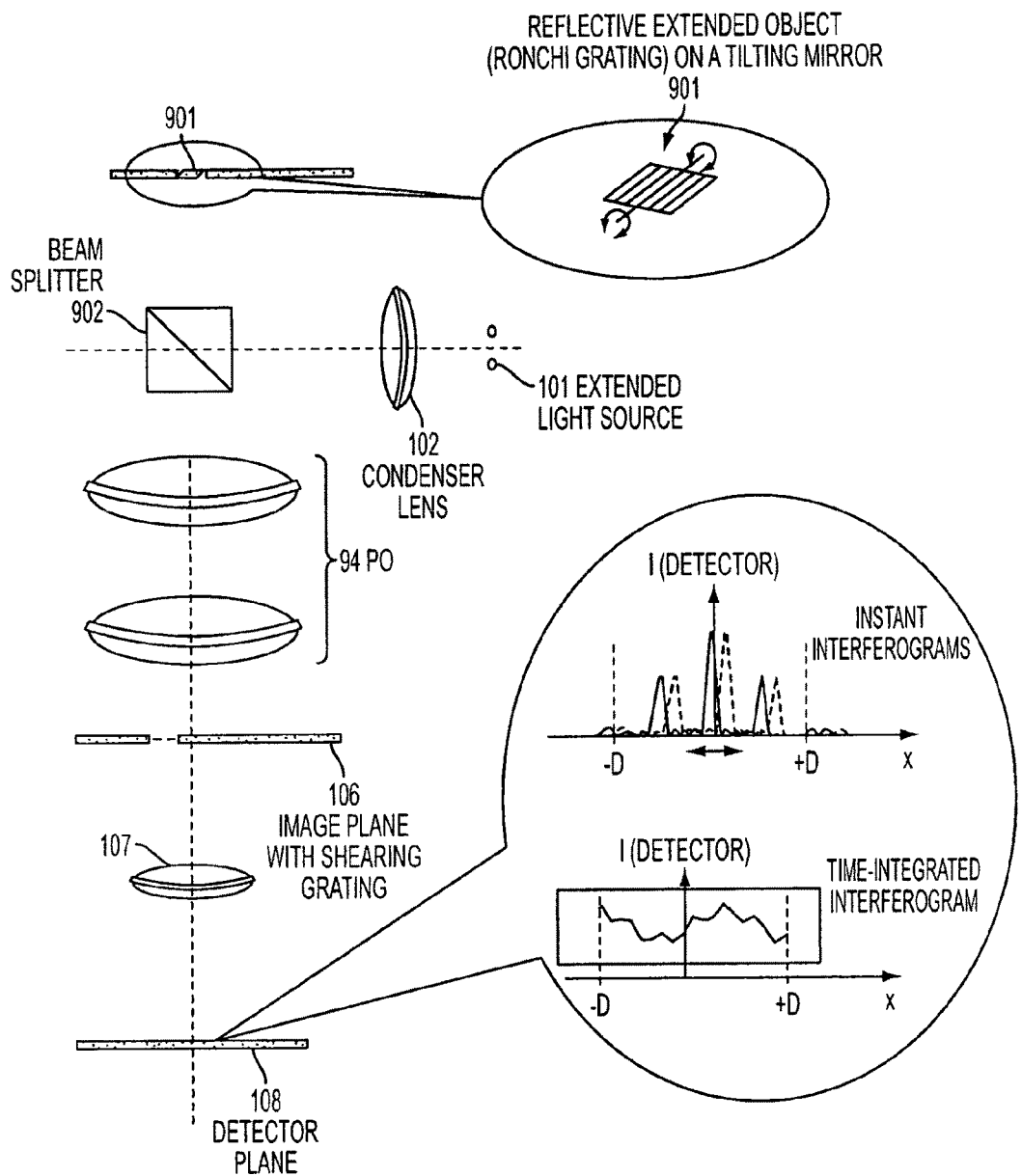
FIG. 9 is an illustration of dynamic pupil fill using a tilting reflective Ronchi grating.

(2) A tilting micro-mirror, such as a mirror from a spatial light modulator (SLM) array, can be used as the entire extended object 103 (see FIG. 9). In order to sweep the pupil 105, the micro-mirror has to tilt in two axes in the object plane. If the micro-mirror can only tilt in one axis, it can be rotated around the axis perpendicular to the object plane, thus allowing a conical sweep of the 2D pupil 105. In practice, such a case is rare.

(3) A reflective object with a varying slope of a reflective surface, such as a parabolic or spherical mirror, which is moved linearly behind a small aperture, can be used as the entire extended object 103.

Note that in the case of reflective elements used to scan the diffraction pattern across the pupil 105, they need not always be located at the object plane. For example, a flat tilting mirror could be located between the object plane and the pupil 105 of the PO 104 (also acting to fold the optical axis of the system).

Figure 8:
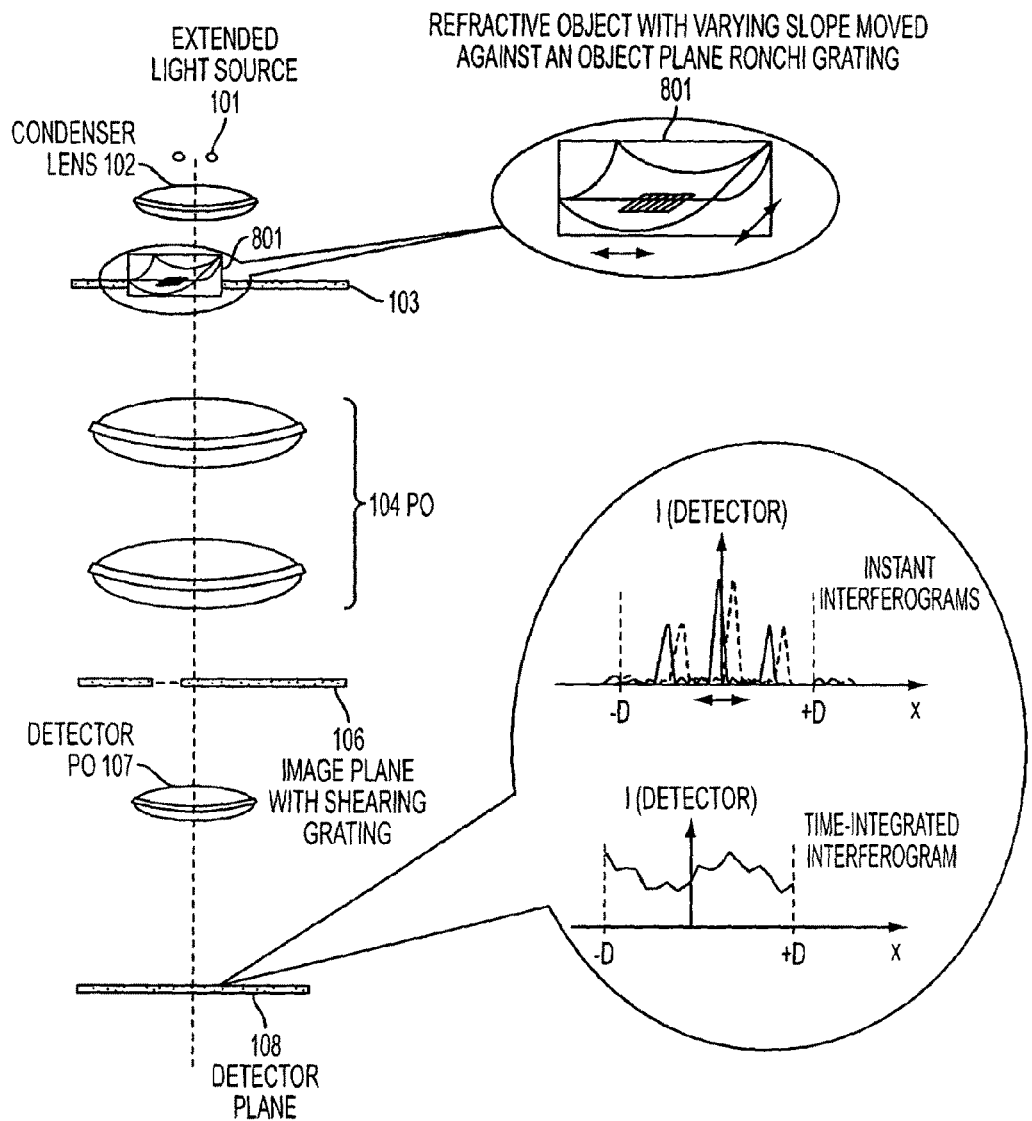
FIG. 8 is another illustration of the arrangement of the optical elements that may be used in the present invention.

The extended object 103 can also be transmissive. In that case, the dynamic pupil fill can be achieved by moving a refractive element with a varying slope of one of its surfaces (e.g., a spherical or parabolic lens) against a small aperture, as shown in FIG. 8. A transmissive grating can also be used, such that various regions on the grating have different grating pitch, and the grating is moved linearly in its plane (i.e., perpendicular to the direction of the propagation of the electromagnetic radiation) so as to vary the direction of the beam (i.e., to scan it across the pupil 105). It is also important to realize that, depending on the particular type of extended object 103 used, the size of the pupil 105 and the scanning approach, maintaining proper focus in the image plane may become a problem, as the diffraction pattern is being scanned across the pupil 105. However, it is currently believed that although it is preferred to maintain focus, some de-focusing is acceptable.

Unless very small shears are utilized, in any of the above implementations, the extended object 103 must have a transmittance pattern (an object plane Ronchi grating matching the shearing grating) superimposed on it to provide additional redistribution of light in the pupil 105, as described in Bratt et al. and Baselmans. In addition, any of the above objects are preferably translatable in two lateral dimensions to accomplish the phase shift readout of fringes preferred in the shearing interferometer measurement.

The final sheared interferogram measured by the CCD detector 108 is a result of integration in time of the momentary sheared interferograms resulting from most of the light concentrated within a small portion of the pupil 105. The momentary sheared interferograms may have high contrast interference fringes only within a relatively small portion of the pupil image in the detector plane formed by the interfering diffraction orders. Their time integral measured by the CCD detector 108 has well-defined interference fringes across the whole pupil 105 that can be used (typically in conjunction with phase-stepping) to compute the wavefront aberration.

This is due to the fact that dynamic pupil fill described above is equivalent to the use of a stationary source corresponding to an actual source convolved with the dynamic movement (source scanning). Thus, regardless of the degree of coherence of illumination from the actual source, the effective source provides fully incoherent illumination.

Figure 5:
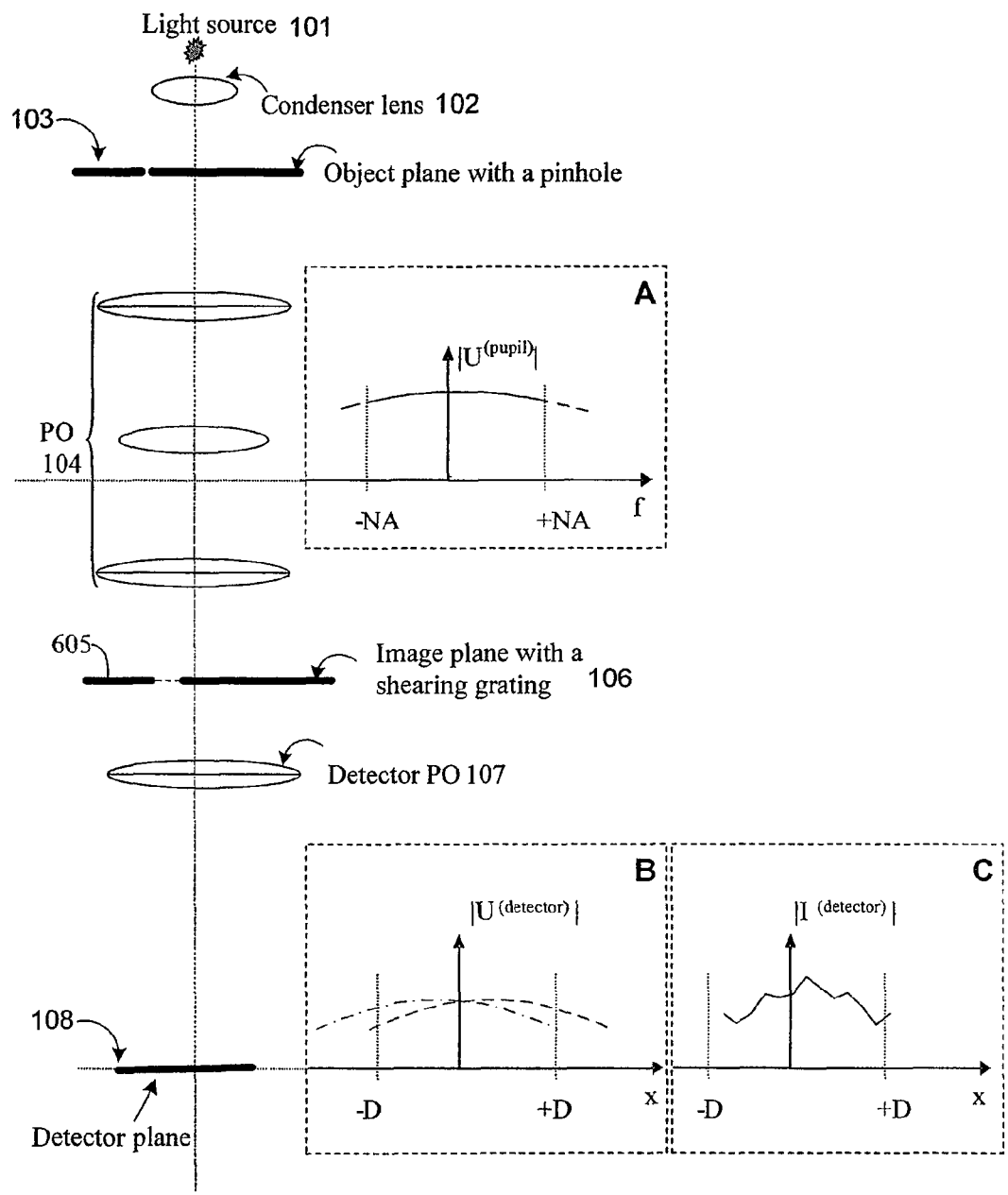
FIG. 5 illustrates the rationale for the present invention, showing the optical exposure system in a stylized, schematic form.

FIG. 5 illustrates the rationale for the present invention, showing the optical exposure system in a somewhat stylized, schematic form. This figure relates to the use of a pinhole in the object plane in order to generate the spherical wave that fills the pupil 105 and whose aberration is measured by the shearing interferometer. As shown in FIG. 5, going from top to bottom in the figure, light from a light source goes through a condenser lens 102, and then through an object plane with a pinhole. The magnitude of the field at the pupil 105 of the projection optics 104 is shown by diagram A, where the pupil 105 coordinate is given as "f". Light then is focused onto an image plane 605, then passes through optional detector projection optics 107, and is detected by the detector 108 in the detector plane. Graph B shows magnitudes of the −1 and +1 diffraction orders formed by the shearing grating, which is located in the image plane 605. Graph C shows an interferogram resulting form the diffraction orders from the shearing grating. Note the visible image variation that is due to the aberrations (phase variations) that are present in the resulting interferogram.

Figure 6:
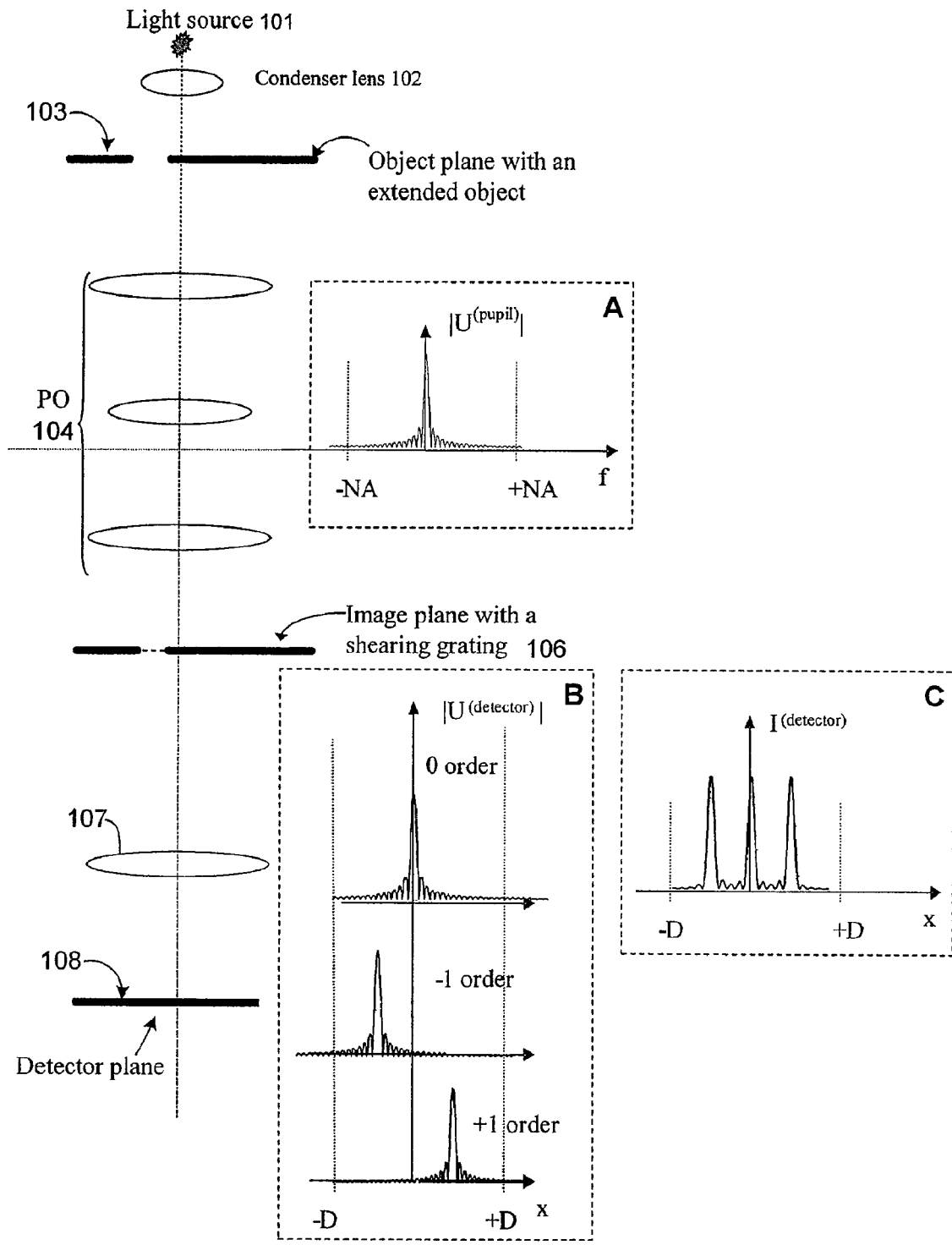
FIG. 6 shows how magnitudes of the diffraction orders and change in an interferogram with an extended object in the object plane.

FIG. 6 shows how the magnitudes of the diffraction orders and change in the interferogram, when an extended object 103 is placed in the object plane that fills only a small portion of the pupil 105, resulting in interferogram fringes of very small (negligible) contrast observed in the detector plane within the non-overlapping peaks corresponding to the sheared diffraction pattern of the extended object 103. As in FIG. 5, Graph A in FIG. 6 shows the magnitude of the field in the pupil 105 of the projection optics 104, with the pupil coordinate "f". Graph B shows the magnitudes of the 0th, −1, and +1 diffraction orders formed by the shearing grating 106, when an extended object 103 is present in the object plane. Graph C shows the interferograms resulting from the diffraction orders from the shearing grating. Because the diffraction orders do not overlap sufficiently, the resulting interferogram only weakly depends on the wavefront aberrations.

Figure 7:
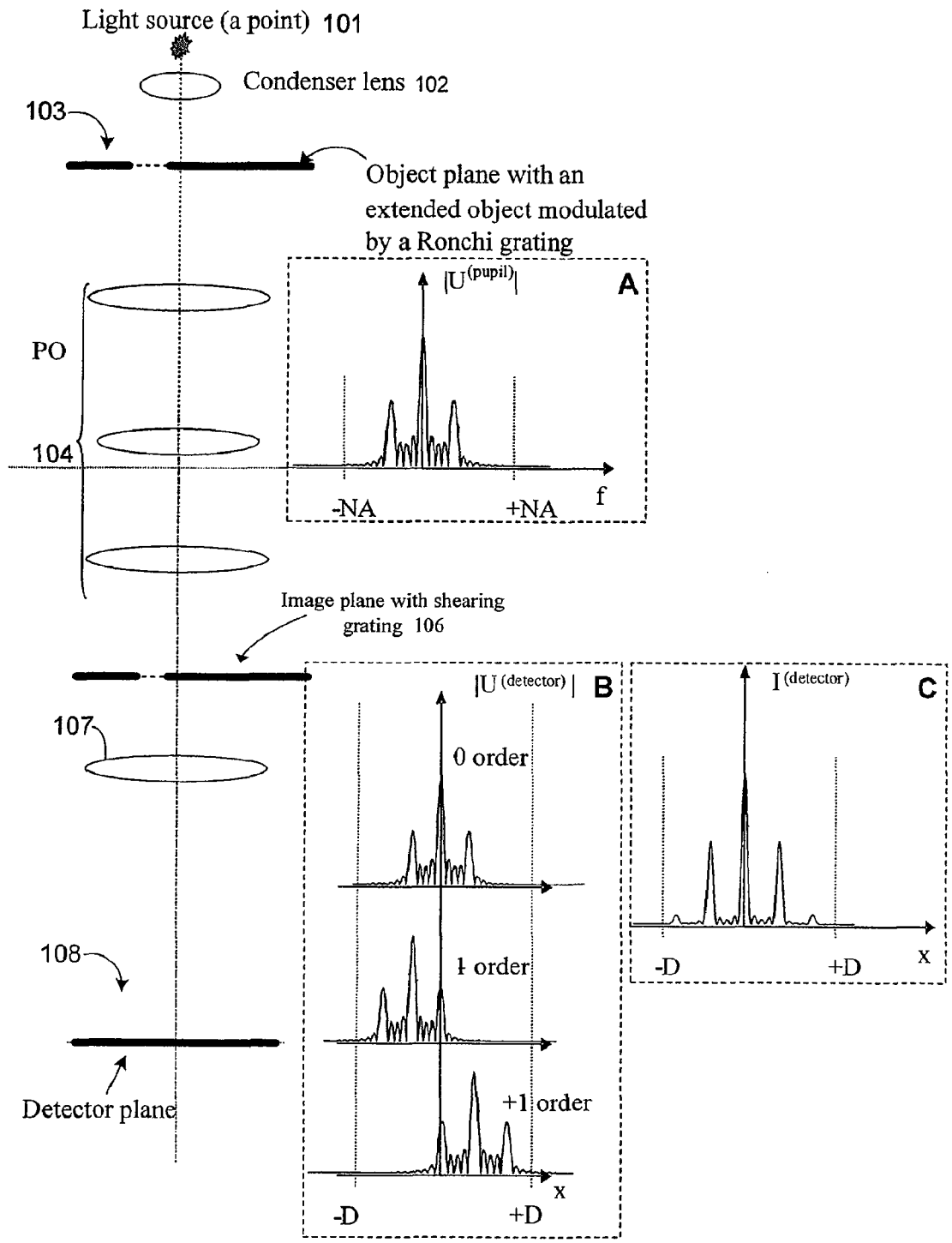
FIG. 7 illustrates an effect of modulating the extended object by a Ronchi grating.

FIG. 7 illustrates the effect of modulating the extended object 103 by a Ronchi grating, that redistributes the light in the pupil 105 to those locations that will mutually overlap as a result of shearing. As with FIGS. 5 and 6, Graph A shows the magnitude of the field in the pupil 105 of the projection optics 104. Graph B shows magnitudes of the 0th, +1 and −1 diffraction orders formed by the shearing grating, and Graph C shows the resulting interferogram from the diffraction orders from the shearing grating and the matching Ronchi grating. As a result of the overlap between the 0th, +1 and −1 diffraction orders, the interferogram in the overlap region (inside the peaks) strongly depends on the wavefront aberrations.

FIG. 8 is another illustration of the arrangement of the optical elements that may be used in the present invention, namely a dynamic pupil fill using a moving refractive object. The illustration of FIG. 8 is primarily applicable to a transmissive extended object 103. For example, as shown in FIG. 8, a transmissive Ronchi grating 801 can be used, with a refractive object having a varying slope that is moved against the object plane. The graphs on the lower right of FIG. 8 illustrate the interferograms resulting with this arrangement. Note that the refractive object, as noted above, may be, for instance, a spherical or a parabolic lens that is being moved against a small aperture.

FIG. 9 is another illustration of dynamic pupil fill using a tilting reflective Ronchi grating 901, with the beam patterns not shown. As shown in FIG. 9, a beam splitter 902 may also be necessary. The reflective extended object 103 (in this case, the Ronchi grating 901) is placed on a tilting mirror. The diagrams at bottom right illustrate the resulting interferogram patterns. The large tilting mirror can be used in combination with an aperture, or can have only a small, flat part portion, or can be a small flat portion of a large tilting object, which is made reflecting. A relatively large mirror, or a larger object, is easier to handle (in other words, to tilt and rotate) compared to a micromirror. The extended object 103 in this case would coincide with the large tilting mirror, as shown in FIG. 9.

Also, a tilting micromirror (such as a mirror in a spatial light-modulator array) may be used as the entire extended object 103.

The present invention has a number of advantages over conventional systems. For example, the dynamic pupil fill eliminates the need for a diffuser in the object plane (e.g., in EUV wavefront sensors), thus resulting in elimination or reduction of speckle-induced wavefront measurement errors.

The dynamic pupil fill also eliminates the need to switch to a special illumination mode during the wavefront measurement. The same illumination mode used during the exposure can be used to perform the wavefront measurement. (However, one still has to properly position a reticle stage with the tilting mirror on it.)

The dynamic pupil fill also allows to fill the PO pupil 105 "tightly," thus significantly reducing the loss of light that occurs with other methods. If necessary or desirable, the dynamic pupil fill allows sampling only the portions of the PO pupil that are of interest.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A system, comprising:
    an illuminator configured to direct a beam of radiation onto an optical device configured to diffract the radiation into a diffraction pattern;
    a projection system configured to project the diffraction pattern onto a shearing grating configured to further diffract the diffraction pattern into a fringe pattern; and
    a detector configured to receive the fringe pattern,
    wherein the optical device is configured to tilt relative to the beam of radiation to scan the diffraction pattern across a pupil of the projection system.

2. The system of claim 1, wherein optical device includes a movable mirror configured to scan the diffraction pattern across the pupil.

3. The system of claim 1, wherein optical device includes reflective optics configured to scan the diffraction pattern across the pupil.

4. The system of claim 1, wherein optical device includes refractive optics configured to scan the diffraction pattern across the pupil.

5. The system of claim 1, wherein the optical device includes a movable mirror with a variable surface slope configured to scan the diffraction pattern across the pupil.

6. The system of claim 1, wherein the detector is located in a plane that is optically conjugate with the pupil.

7. The system of claim 1, wherein the detector comprises a charge-coupled device.

8. The system of claim 1, wherein the detector is configured to detect a wavefront aberration in the fringe pattern.

9. The system of claim 1, wherein the optical device is transmissive.

10. The system of claim 1, wherein the optical device is reflective.

11. A method, comprising:
- generating, using a optical device, a diffraction pattern from a beam of radiation;
- scanning the diffraction pattern across a pupil of an optical system by moving the optical device relative to the beam of radiation;
- generating a fringe pattern associated with the diffraction pattern;
- determining wavefront parameters from the fringe pattern; and
- generating an interferogram graph from the wavefront parameters.

12. The method of claim 11, wherein the scanning step includes using a transmissive optical device.

13. The method of claim 11, wherein the scanning step includes using a reflective optical device.

14. The method of claim 11, wherein the scanning step includes using a mirror to scan the diffraction pattern across the pupil.

15. The method of claim 11, wherein the scanning step includes using reflective optics to scan the diffraction pattern across the pupil.

16. The method of claim 11, wherein the scanning step includes using refractive optics to scan the diffraction pattern across the pupil.

17. The method of claim 11, wherein the scanning step includes using a mirror with a variable surface slope to scan the diffraction pattern across the pupil.

18. The method of claim 11, wherein the determining step includes using a charge-coupled device to determine the wavefront parameters.

19. A method, comprising:
- generating, using a optical device in an object plane, a diffraction pattern, the diffraction pattern being directed at an optical system;
- receiving the diffraction pattern at an image plane;
- directing, using a shearing grating, a fringe pattern from the diffraction pattern onto a detector;
- receiving the fringe pattern at the detector while substantially simultaneously scanning the diffraction pattern across a pupil of the optical system by moving the optical device relative to a beam of radiation;
- determining a wavefront aberration from the fringe pattern; and
- generating an interferogram graph from the determined wavefront aberration.

20. The method of claim 19, wherein the receiving step includes using the detector in a plane that is optically conjugate with the pupil.

* * * * *

UNITED STATES PATENT AND TRADEMARK OFFICE
CERTIFICATE OF CORRECTION

PATENT NO.        : 7,768,653 B2
APPLICATION NO.   : 12/178524
DATED             : August 3, 2010
INVENTOR(S)       : Latypov et al.

It is certified that error appears in the above-identified patent and that said Letters Patent is hereby corrected as shown below:

Title page, (73) Assignee section, please delete "ASML Hodling N.V.", and insert
--ASML Holding N.V.--

Title page, (63) Related U.S. Application Data section, please delete ", now U.S. Pat. No. 7,408,641"

Signed and Sealed this
Seventh Day of June, 2011

David J. Kappos
*Director of the United States Patent and Trademark Office*